US012633614B2

(12) United States Patent
Liu

(10) Patent No.: US 12,633,614 B2
(45) Date of Patent: May 19, 2026

(54) REMOTE CONTROLLER BACK SHELL

(71) Applicant: Gaofei Liu, Yibin (CN)

(72) Inventor: Gaofei Liu, Yibin (CN)

( * ) Notice: Subject to any disclaimer, the term of this patent is extended or adjusted under 35 U.S.C. 154(b) by 599 days.

(21) Appl. No.: 18/297,529

(22) Filed: Apr. 7, 2023

(65) Prior Publication Data

US 2023/0327267 A1     Oct. 12, 2023

(30) Foreign Application Priority Data

Apr. 9, 2022   (CN) .......................... 202220806726.4

(51) Int. Cl.
| | |
|---|---|
| *H01M 50/264* | (2021.01) |
| *H01M 50/202* | (2021.01) |
| *H01M 50/227* | (2021.01) |
| *H01M 50/247* | (2021.01) |
| *H05K 5/00* | (2025.01) |

(52) U.S. Cl.
CPC ....... *H01M 50/264* (2021.01); *H01M 50/202* (2021.01); *H01M 50/227* (2021.01); *H01M 50/247* (2021.01); *H05K 5/0086* (2013.01)

(58) Field of Classification Search
CPC ............ H01M 50/264; H01M 50/247; H01M 50/202; H01M 50/227; H05K 5/0086
See application file for complete search history.

(56) References Cited

U.S. PATENT DOCUMENTS

| | | | | |
|---|---|---|---|---|
| 4,842,966 | A | * | 6/1989 | Omori ................. H01M 50/216 439/627 |
| 4,868,074 | A | * | 9/1989 | Omori ................. H01M 50/216 429/100 |
| 5,039,580 | A | * | 8/1991 | Mori .................... H05K 5/0208 429/97 |
| 5,181,192 | A | * | 1/1993 | Paratte ................... G04C 10/00 368/204 |
| 5,188,912 | A | * | 2/1993 | Katoh ................. H01M 50/216 429/96 |
| 5,193,220 | A | * | 3/1993 | Ichinohe .................. H03J 1/00 361/740 |
| 5,371,349 | A | * | 12/1994 | Kimura .............. G06K 19/0706 429/96 |
| 5,526,233 | A | * | 6/1996 | Hayakawa ........... G06K 19/077 361/728 |
| 5,529,503 | A | * | 6/1996 | Kerklaan ......... G06K 19/07735 439/911 |

(Continued)

*Primary Examiner* — Matthew J Merkling
(74) *Attorney, Agent, or Firm* — Hemisphere Law, PLLC

(57) ABSTRACT

A remote controller back shell includes a body provided with a first limit slot and a battery compartment provided with a pinching part, the pinching part is provided with a male buckle, the first limit slot is provided with a female buckle corresponding to the male buckle, the battery compartment is fixedly connected to the first limit slot through an assembly hole provided on the body, the pinching part is resiliently connected to the battery compartment, the battery compartment is provided with a resilient block, the resilient block is provided with a positioning post, the first limit slot is provided with a positioning hole corresponding to the positioning post, a button battery is disposed in a second limit slot in the battery compartment. The battery compartment is connected to the body in a snap-fit manner, there is no need to disassemble an entire machine, when replacing the button battery.

5 Claims, 2 Drawing Sheets

1

(56) References Cited

U.S. PATENT DOCUMENTS

| | | | | |
|---|---|---|---|---|
| 5,552,240 A | * | 9/1996 | Derstine | H01M 50/216 |
| | | | | 429/96 |
| 5,777,316 A | * | 7/1998 | Horie | G06K 19/0706 |
| | | | | 429/97 |
| 5,843,595 A | * | 12/1998 | Kawakatsu | H01M 50/216 |
| | | | | 429/97 |
| 5,876,241 A | * | 3/1999 | Frantz | H01M 50/216 |
| | | | | 429/100 |
| 5,922,489 A | * | 7/1999 | Adachi | H01M 4/624 |
| | | | | 429/96 |

* cited by examiner

<u>1</u>

REMOTE CONTROLLER BACK SHELL

FIELD OF THE DISCLOSURE

The disclosure relates to the field of remote controllers, and in particular to a remote controller back shell.

BACKGROUND OF THE DISCLOSURE

A button battery circuit is generally a power supply for timekeeping circuits, indication signals and other low-energy signals. However, because of limited power storage capacity, the button battery circuit is replaced frequently and is not easy to set externally. At present, for most of remote controllers using the button battery, their battery compartments each are mostly fixed on circuit boards, and a replacement of the button battery requires to waste lots of time to disassemble a whole machine. At the same time, a positioning of the button battery depends on a snap connection between a buckle of the battery compartment and the circuit board. During processes of battery replacement, dropping, impact, etc., the battery compartment may encounter issues such as improper of the snap connection, and wear of the buckle of the battery compartment, thereby making the button battery shift with the battery compartment, which leads to poor contact between the button battery and a resilient sheet and reduces reliability of electronic products.

SUMMARY OF THE DISCLOSURE

In order to overcome current technical problems of quick replacement of a button battery and an offset of the battery compartment resulting in poor conductivity of the button battery, the disclosure provides a remote controller back shell.

The disclosure provides a remote controller back shell, including a body and a battery compartment, the body and the battery compartment are connected each other in a snap-fit manner, a side of the battery compartment is provided with a pinching part, a side of the pinching part is provided with a male buckle, the body is provided with a first limit slot, a side of the first limit slot is provided with a female buckle, a position of the female buckle corresponds to a position of the male buckle, a shape of the first limit slot corresponds to a shape of the battery compartment, a side of the body adjacent to the first limit slot is provided with an assembly hole, the battery compartment is fixedly connected to the first limit slot through the assembly hole, and the pinching part is resiliently connected to the battery compartment; another side of the battery compartment facing away from the pinching part is provided with a resilient block, an end of the resilient block is fixedly connected to the battery compartment, the resilient block is provided with a positioning post, the first limit slot is provided with a positioning hole, and a position of the positioning post corresponds to a position of the positioning hole.

In an embodiment, the battery compartment is provided with a second limit slot, an end of the second limit slot facing away from the pinching part is provided with an opening, a shape formed by combination of the second limit slot and the opening is an arc between semicircular and circular, and the second limit slot is used to hold the button battery.

In an embodiment, an end of the pinching part is provided with a first groove and the battery compartment is provided with a second groove, the first groove and the second groove are disposed as a handgrip position, and another end of the pinching part is fixedly connected to another end of the battery compartment facing away from the resilient block.

In an embodiment, the body is provided with a plurality of support strips, and the plurality of support strips are disposed in the first limit slot.

In an embodiment, the body is provided with a slide slot, the slide slot is disposed between the assembly hole and the positioning hole, and the positioning post is fixedly connected to the positioning hole through the slide slot.

In an embodiment, the slide slot is disposed with a first inclined surface, an inclined angle of the first inclined surface is greater than 0° and less than 90°, the positioning post is disposed with a second inclined surface at an end facing away from the resilient block, the second inclined surface of the positioning post corresponds to the first inclined surface of the slide slot, and the resilient block is resiliently connected to the battery compartment.

In an embodiment, the body and the battery compartment are made of plastic.

Compared with the prior art, the remote controller back shell of the disclosure provides has the following advantages.

1. In the remote controller back shell, the button battery is placed in the second limit slot of the battery compartment, the male buckle is connected with the female buckle, at the same time, the positioning post and the positioning hole are connected each other. When replacing the button battery, the user can press the handgrip position of the pinching part and the positioning post at the same time, so that the male buckle and the female buckle are separated, the positioning post and the positioning hole are separated. The battery compartment and the body are connected each other in a snap-fit manner, when the button battery is to be replaced, the button battery can be quickly replaced by disassembling the buckles (i.e. male and female buckles) without disassembling the whole machine.

2. In the remote controller back shell, the body is provided with the first limit slot, the first limit slot is shaped the same as the battery compartment, the first limit slot is provided with the plurality of support strips. The button battery is placed in the second limit slot of the battery compartment, the second limit slot is shaped in an arc larger than the semicircle and smaller than the circle. The first limit slot is used to fix a position of the battery compartment, the second limit slot is used to fix a position of the button battery, the support strips is used to support the button battery, so that the button battery closely fits the second limit slot to avoid poor contact with the conductive resilient sheet of the remote controller when the button battery is loose in the second limit slot.

3. By simultaneously pressing the handgrip position and positioning post to open the battery compartment, so that the opening of the battery compartment requires user physical coordination to avoid young children opening the battery compartment to remove the button battery caused by accidental ingestion.

Figure 1:
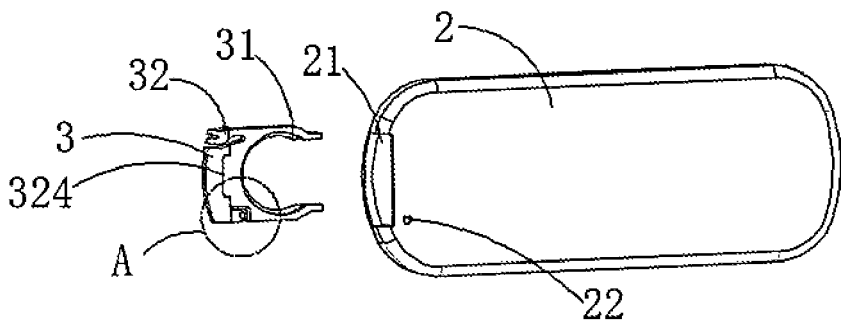
FIG. 1 is an exploded view of a remote controller back shell provided by the disclosure.

DESCRIPTION OF REFERENCE NUMERALS 1. remote controller back shell; 2. body; 21. assembly hole; 22. positioning hole; 23. first limit slot; 24. support strip; 25. positioning hole; 26. slide slot; 3. battery compartment; 31. second limit slot; 32. pinching part; 321. female buckle; 322. male buckle; 323. first groove; 324. second groove; 33. resilient block; 34. positioning post.

DETAILED DESCRIPTION OF EMBODIMENTS

In order to make purposes, technical solutions and advantages of the disclosure more clearly understood, the following is a further detailed description of the disclosure in conjunction with the accompanying drawings and examples of implementation. It should be understood that the specific embodiments described herein are used only to explain the disclosure and are not intended to limit the disclosure.

It should be noted that when an element is descripted to be "fixed" to another element, it may be directly disposed on another element or there may be an inter-mediated element between the element and another element. When an element is descripted to be "connected" to another element, it may be directly connected to another element or there may be an inter-mediated element connected between the element and another element. Terms "vertical", "horizontal", "left", "right", and similar expressions are used herein are used for illustrative purposes only.

Figure 2:
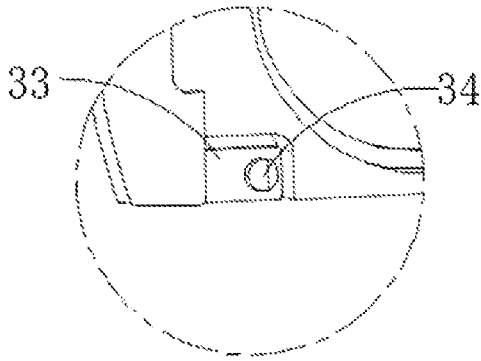
FIG. 2 is an enlarged view of Part A in the FIG. 1.
Figure 3:
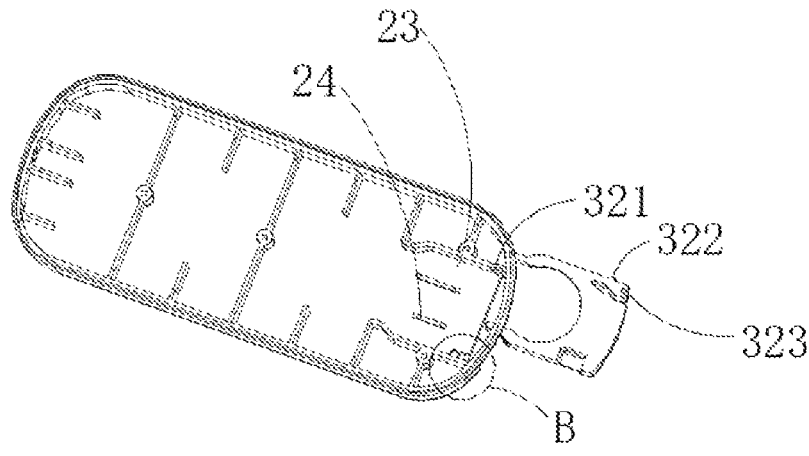
FIG. 3 is another exploded view of the remote controller back shell provided by the disclosure.
Figure 4:
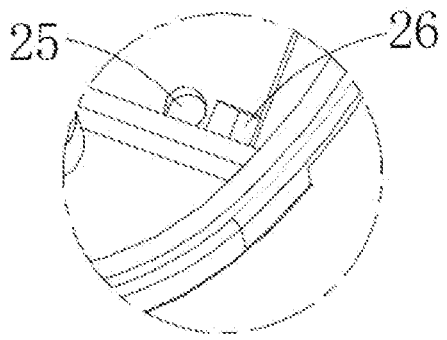
FIG. 4 is an enlarged view of Part B in FIG. 3.

Referring to FIGS. 1 to 4, the disclosure provides a remote controller back shell, including a body 2 and a battery compartment 3, the body 2 and the battery compartment 3 are connected each other in a snap-fit manner, a side of the battery compartment 3 is provided with a pinching part 32, a side of the pinching part 32 is provided with a male buckle 322, the body 2 is provided with a first limit slot 23, a side of the first limit slot 23 is provided with a female buckle 321, a position of the female buckle 321 corresponds to a position of the male buckle 322, a shape of the first limit slot 23 corresponds to a shape of the battery compartment 3, a side of the body 2 adjacent to the first limit slot 23 is provided with an assembly hole 21, the battery compartment 3 is fixedly connected to the first limit slot 23 through the assembly hole 21, and the pinching part 32 is resiliently connected to the battery compartment 3; another side of the battery compartment 3 facing away from the pinching part 32 is provided with a resilient block 33, an end of the resilient block 33 is fixedly connected to the battery compartment 3, the resilient block 33 is provided with a positioning post 34, the first limit slot 23 is provided with a positioning hole 22, and a position of the positioning post 34 corresponds to a position of the positioning hole 22.

It can be understood that, a button battery is placed in the second limit slot 31, the male buckle 322 and the female buckle 321 are connected, and the positioning post 34 and the positioning hole 22 are snapped. A shape of the first limit slot 23 corresponds to a shape of the battery compartment 3 to avoid poor contact between the button battery in the battery compartment 3 and a resilient sheet of a motherboard of the remote controller when the remote controller falls or shakes.

It can be understood that, the battery compartment 3 is assembled and disassembled from the body 2 through the assembly hole 21. By pressing the pinching part 32 and the positioning post 34, the male buckle 322 and the female buckle 321 are separated, and the positioning post 34 and positioning hole 25 are separated, so that the button battery can be quickly replaced.

In an embodiment, the battery compartment 3 is provided with a second limit slot 31, an end of the second limit slot 31 facing away from the pinching part 32 is provided with an opening, a shape formed by combination of the second limit slot 31 and the opening is an arc between semicircular and circular, and the second limit slot 31 is used to hold the button battery.

It can be understood that, the button battery is placed in the second limit slot 31, and the second limit slot 31 is provided with the opening at one end so that the second limit slot 31 can clamp the button battery by pressing the opening. At the same time, the shape of the second limit slot 31 with the opening is the arc between semicircular and circular to avoid the button battery from detaching from the opening.

In an embodiment, an end of the pinching part 32 is provided with a first groove 323 and the battery compartment 3 is provided with a second groove 324, the first groove 323 and the second groove 324 are disposed as a handgrip position, and another end of the pinching part 32 is fixedly connected to another end of the battery compartment 3 facing away from the resilient block 33.

It can be understood that, the first groove 323 and the second groove 324 are set in the handgrip position, and one end of the pinching part 32 is set in the handgrip position, while the other end of the pinching part 32 is fixedly connected to the battery compartment 3. For example, when disassembling the battery compartment 3, the first groove 323 is pinched to deform the pinching part 32, and the male buckle 322 on the pinching part 32 disengages from the female buckle 321 on the body 2.

In an embodiment, the body 2 is provided with a plurality of support strips 24, and the plurality of support strips 24 are disposed in the first limit slot 23.

It can be understood that, the first limit slot 23 is provided with the plurality of support strips 24, the support strips 24 are fixedly connected to the body 2. The support strips 24 are used to tightly fit the button battery into the second limit slot 31, increasing electrical connection stability between the button battery and the resilient sheet of the motherboard of the remote controller.

In an embodiment, the body 2 is provided with a slide slot 26, the slide slot 26 is disposed between the assembly hole 21 and the positioning hole 25, and the positioning post 34 is fixedly connected to the positioning hole 22 through the slide slot 26.

It can be understood that, there is the slide slot 26 between the assembly hole 21 and the positioning hole 25, which acts as a guide rail to smoothly engage and separate the positioning post 34 from the positioning hole 22.

In an embodiment, the slide slot 26 is disposed with a first inclined surface, an inclined angle of the first inclined surface is greater than 0° and less than 90°, the positioning post 34 is disposed with a second inclined surface at an end facing away from the resilient block 33, the second inclined surface of the positioning post 34 corresponds to the first inclined surface of the slide slot 26, and the resilient block 33 is resiliently connected to the battery compartment 3.

It can be understood that, the slide slot is disposed with a first inclined surface, an inclined angle of the first inclined surface is greater than 0° and less than 90°, one end of the positioning post is disposed with a second inclined surface. When the positioning post 34 moves along the slide slot 26, the positioning post 34 is squeezed by the slide slot 26, causing deformation of the resilient block 33. When the positioning post 34 enters the positioning hole 25, the resilient block 33 returns to its original state. When disassembling the battery compartment 3, the resilient block 33 can be changed by pressing the positioning post 34 to pull out the battery compartment 3.

In an embodiment, the body 2 and the battery compartment 3 are made of plastic.

It can be understood that, the body 2 and battery compartment 3 are made of plastic, the body 2 and the support strips 24 can be injection molded at one time, and the battery compartment 3, the resilient block 33, and the pinching part 32 can be injection molded at one time. By adopting one-time injection molding, it can reduce assembly and processing time of various components and optimize costs.

Above is only the preferred embodiment of the disclosure and is not intended to limit the disclosure. Any modifications, equivalent replacements, and improvements made within principles of the disclosure should be included in a protection scope of the disclosure.

What is claimed is:

1. A remote controller back shell, comprising a body and a battery compartment, wherein the body and the battery compartment are connected to each other in a snap-fit manner, a side of the battery compartment is provided with a pinching part, a side of the pinching part is provided with a male buckle, the body is provided with a first limit slot, a side of the first limit slot is provided with a female buckle, a position of the female buckle corresponds to a position of the male buckle, a shape of the first limit slot corresponds to a shape of the battery compartment, a side of the body adjacent to the first limit slot is provided with an assembly hole, the battery compartment is fixedly connected to the first limit slot through the assembly hole, and the pinching part is resiliently connected to the battery compartment;

wherein another side of the battery compartment facing away from the pinching part is provided with a resilient block, an end of the resilient block is fixedly connected to the battery compartment, the resilient block is provided with a positioning post, the first limit slot is provided with a positioning hole, and a position of the positioning post corresponds to a position of the positioning hole;

wherein the body is provided with a slide slot, the slide slot is disposed between the assembly hole and the positioning hole, and the positioning post is fixedly connected to the positioning hole through the slide slot; and wherein the slide slot is disposed with a first inclined surface, an inclined angle of the first inclined surface is greater than 0° and less than 90°, the positioning post is disposed with a second inclined surface at an end facing away from the resilient block, the second inclined surface of the positioning post corresponds to the first inclined surface of the slide slot, and the resilient block is resiliently connected to the battery compartment.

2. The remote controller back shell according to claim 1, wherein the battery compartment is provided with a second limit slot, an end of the second limit slot facing away from the pinching part is provided with an opening, a shape formed by combination of the second limit slot and the opening is an arc between semicircular and circular, and the second limit slot is used to hold a button battery.

3. The remote controller back shell according to claim 1, wherein an end of the pinching part is provided with a first groove and the battery compartment is provided with a second groove, the first groove and the second groove are disposed as a handgrip position, and another end of the pinching part is fixedly connected to another end of the battery compartment facing away from the resilient block.

4. The remote controller back shell according to claim 1, wherein the body is provided with a plurality of support strips, and the plurality of support strips are disposed in the first limit slot.

5. The remote controller back shell according to claim 1, wherein the body and the battery compartment are made of plastic.

* * * * *